United States Patent
Joist

[19]

[11] Patent Number: 5,504,656

[45] Date of Patent: Apr. 2, 1996

[54] DEVICE FOR REMOVING A PLUG-IN MODULE

[75] Inventor: Michael Joist, Gaggenau, Germany

[73] Assignee: Schroff GmbH, Straubenhardt, Germany

[21] Appl. No.: 386,827

[22] Filed: Feb. 10, 1995

[30] Foreign Application Priority Data

Aug. 12, 1994 [DE] Germany .................. 44 28 529.9

[51] Int. Cl.⁶ .................................................. H05K 5/00
[52] U.S. Cl. .................. 361/754; 361/798; 361/801; 361/759; 211/41; 439/157
[58] Field of Search ................... 361/732, 740, 361/754, 755, 759, 798, 801, 725–727; 439/152, 153, 155, 157, 160; 211/41; 403/16, 321, 330

[56] References Cited

U.S. PATENT DOCUMENTS

| | | | |
|---|---|---|---|
| 4,580,192 | 4/1986 | Beun ......................... | 361/395 |
| 4,603,375 | 7/1986 | Miller et al. ............... | 361/399 |
| 4,996,631 | 2/1991 | Freehauf ................... | 361/415 |
| 5,428,507 | 6/1995 | Chatel et al. ............. | 361/798 |

*Primary Examiner*—Leo P. Picard
*Assistant Examiner*—Y. Whang
*Attorney, Agent, or Firm*—Spencer & Frank

[57] ABSTRACT

A device for removing a plug-in module adapted for insertion into a module rack is provided where the module rack has a front profile rail including a front strip and a front face, the front strip having a front edge. The plug-in module comprises a retaining block for securing the plug-in module to the front profile rail; a printed wiring board equipped with electronic components and screwed to the retaining block; and a front panel secured to the retaining block. The device includes a two-armed bell crank having a long lever arm and a short lever arm and being pivotally secured to the retaining block by a pivot pin. The long lever arm of the bell crank constitutes an actuation handle for the device. The device is configured such that the short lever arm of the bell crank includes an inner pressure exerting shoulder and an outer pressure exerting shoulder, where the inner pressure exerting shoulder of the short lever arm rests on the front face of the profile rail and the outer pressure exerting shoulder is disposed at a distance from and opposite the front edge of the front strip when the plug-in module is inserted into the module rack. The device is further configured such that the inner pressure-exerting shoulder is located at a distance from the pivot axis of the bell crank that is less than a distance between the outer pressure-exerting shoulder and the pivot axis.

6 Claims, 4 Drawing Sheets 5,504,656

DEVICE FOR REMOVING A PLUG-IN MODULE

CROSS-REFERENCE TO RELATED APPLICATION

This application claims the priority of application Serial No. P 44 28 529.9, filed in Germany on Aug. 12, 1994, which is incorporated herein by reference.

FIELD OF THE INVENTION

The present invention relates to a device for removing a plug-in module adapted for insertion into a module rack where the module rack has a front profile rail including a front strip and a front face, the front strip having a front edge. The plug-in module comprises a retaining block for securing the plug-in module to the front profile rail; a printed wiring board equipped with electronic components and screwed to the retaining block; and a front panel secured to the retaining block. The device includes a two-armed bell crank having a long lever arm and a short lever arm and pivotally secured to the retaining block by a pivot pin. The long lever arm of the bell crank constitutes an actuation handle for the device.

BACKGROUND OF THE INVENTION

The invention is applicable to plug-in modules of any size that can be inserted into module racks, of the kind often used to make up electronic and electrical equipment. The plug-in modules and guide rails are disposed both next to and one above one other in a module rack.

Each plug-in module is connected to the module rack with the aid of multipin plug connectors. Knife strips and spring strips are used which are equipped with up to ninety six spring contacts. Inserting such three-row plug connectors requires strong forces, and this is especially true when the plug-in modules are to be removed, or pulled out, from the module rack. Without suitable aids, plug-in modules are thus almost impossible to remove from the module racks.

Various embodiments of lever systems with actuating handles are known as aids in the insertion and removal of plug-in modules. These systems are disposed in the region of both the bottom and the top of the front panel of the plug-in module to be inserted or removed.

In one of these systems, a bell crank has a protrusion that engages a recess of a strip provided on the front of the profile rail of the module rack and that thus serves as an aid in the insertion and removal of the plug-in module. Because of the shortness of the lever arm between the above protrusion and the pivot axis of the bell crank, however, which shortness is dictated by structural requirements necessary to meet standards, the forces that can be exerted on the plug-in module upon actuation of the lever system are limited, and as a result, the static friction between the springs and knives of the plug connectors that must be overcome when beginning to remove the plug-in module can be overcome only with considerable effort.

SUMMARY OF THE INVENTION

The object of the invention is to provide a device for removing plug-in modules from module racks in such a way that the actuation forces necessary to effect a removal of the plug-in modules are considerably reduced when compared to forces that must be employed in similar devices of the prior art.

The above and other objects are accomplished according to the invention by the provision of a device of the above-mentioned type which is configured such that the short lever arm of the bell crank includes an inner pressure exerting shoulder and an outer pressure exerting shoulder, where the inner pressure exerting shoulder of the short lever arm rests on the front face of the profile rail and the outer pressure exerting shoulder is disposed at a distance from and opposite the front edge of the front strip when the plug-in module is inserted into the module rack. The device is further configured such that the inner pressure-exerting shoulder is located at a distance from the pivot axis of the bell crank that is less than a distance between the outer pressure-exerting shoulder and the pivot axis.

Because the removal of the plug-in module is effected initially while the inner pressure-exerting shoulder seated on a shorter lever arm is exerting pressure on a front face of the profile rail (note that even though only a short displacement of the plug-in module away from the profile rail is attainable, nevertheless the high static friction in the plug connector is overcome without problems), and then further removal is taken over by the second, outer pressure-exerting shoulder (where greater displacement of the plug-in module occurs with less exertion of force), it is possible with very simple means to make the removal process of a plug-in module connected with a multipin plug connector considerably easier.

The contemplated design requires little space, so that the dimensional standards specified for the device itself and for the plug-in module and the profile rail, can be adhered to. Of decisive significance for the advantageous mode of operation of the device are the two pressure-exerting shoulders, seated on different-length lever arms and working in a coordinated fashion with one another.

An advantageous lever ratio is attained if the inner pressure-exerting shoulder is located at a distance from the pivot axis of the bell crank that is at most half the distance between the outer pressure-exerting shoulder and the pivot axis of the bell crank.

Production of the bell crank becomes simple if the short lever arm has an outer face, a portion of which forms the inner pressure-exerting shoulder.

Suitably, the short lever arm can be configured to include a continuation, a portion of which forms the outer pressure-exerting shoulder.

It is within the concept of the invention to provide a protrusion on the short lever arm which can serve as a supplemental aid in the insertion and removal of the plug-in module. For this purpose, an additional pressure-exerting shoulder may be provided on the protrusion which, with the plug-in module inserted, is disposed opposite an inner edge of a recess in the front strip of the profile rail.

The invention will be described below in greater detail in connection with embodiments thereof that are illustrated in the drawing figures.

3

Figure 2:
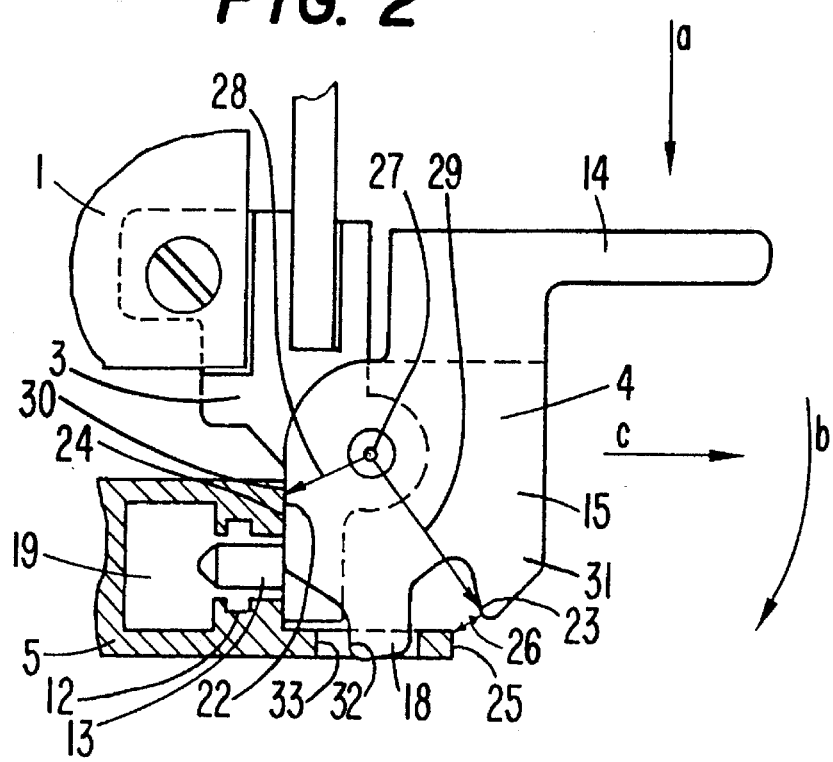
FIG. 2 is a side elevational view of the device of FIG. 1 showing the profile rail in cross-section and the plug-in module as being fully inserted.
Figure 3:
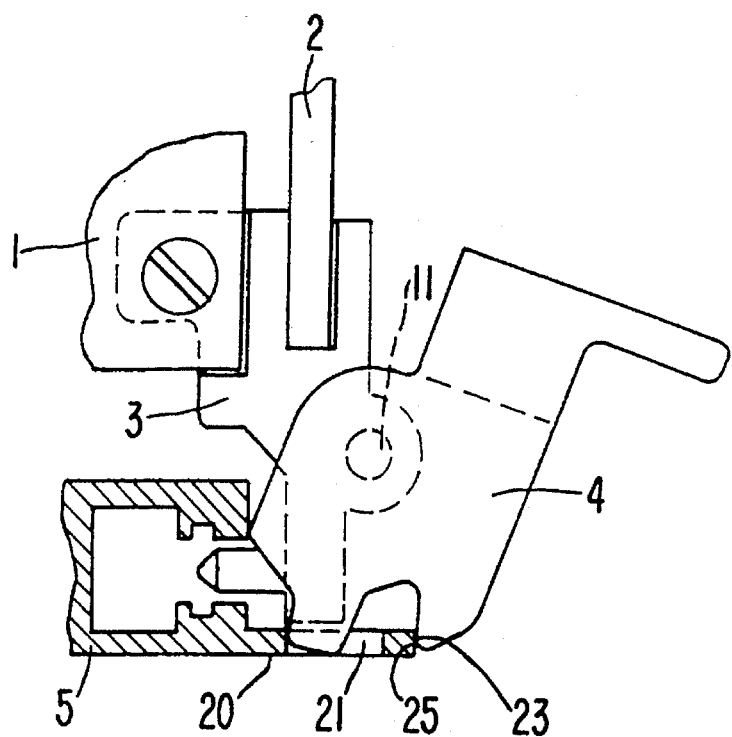
Figure 4:
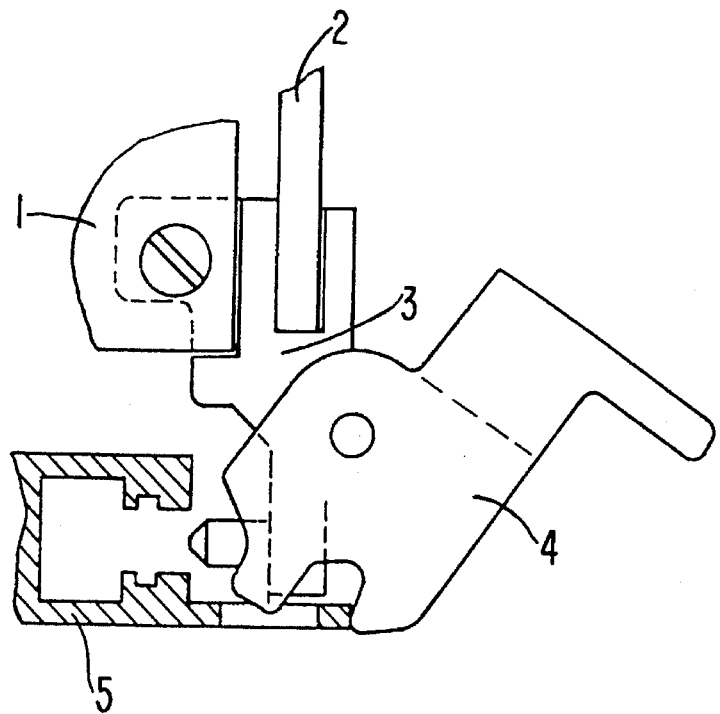
Figure 5:
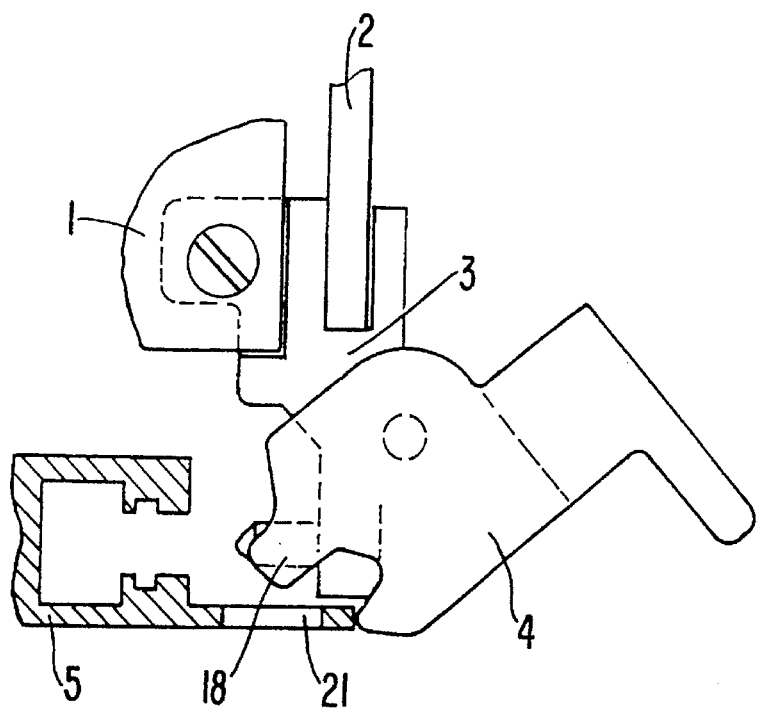
Figure 6:
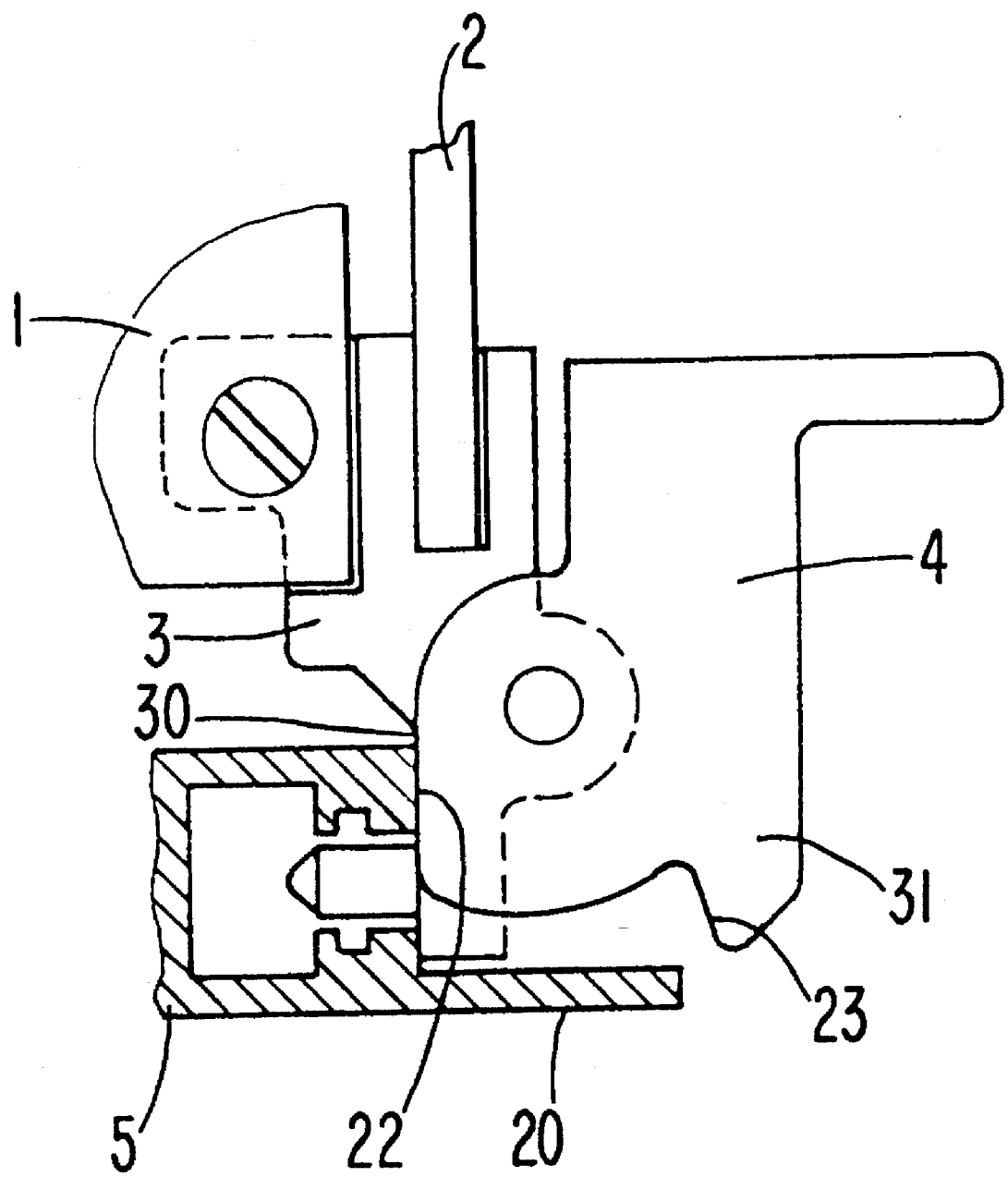

FIG. 3 is a view similar to that of FIG. 2 showing the plug-in module in a first removal phase during which pressure is exerted on the actuation handle, the inner pressure-exerting shoulder is still resting on the profile rail, and the outer pressure-exerting shoulder has just come to rest on the strip of the profile rail;

FIG. 4 is a view similar to that of FIG. 2 showing the plug-in module in a second removal-phase during which the outer pressure-exerting shoulder rests on the strip of the profile rail alone;

FIG. 5 is a view similar to that of FIG. 2 showing the plug-in module as having been removed, and the outer pressure-exerting shoulder as still being in contact with the front edge of the strip of the profile rail; and FIG. 6 is a view similar to that of FIG. 2 showing a second embodiment of the invention.

DESCRIPTION OF THE PREFERRED EMBODIMENTS

Figure 1:
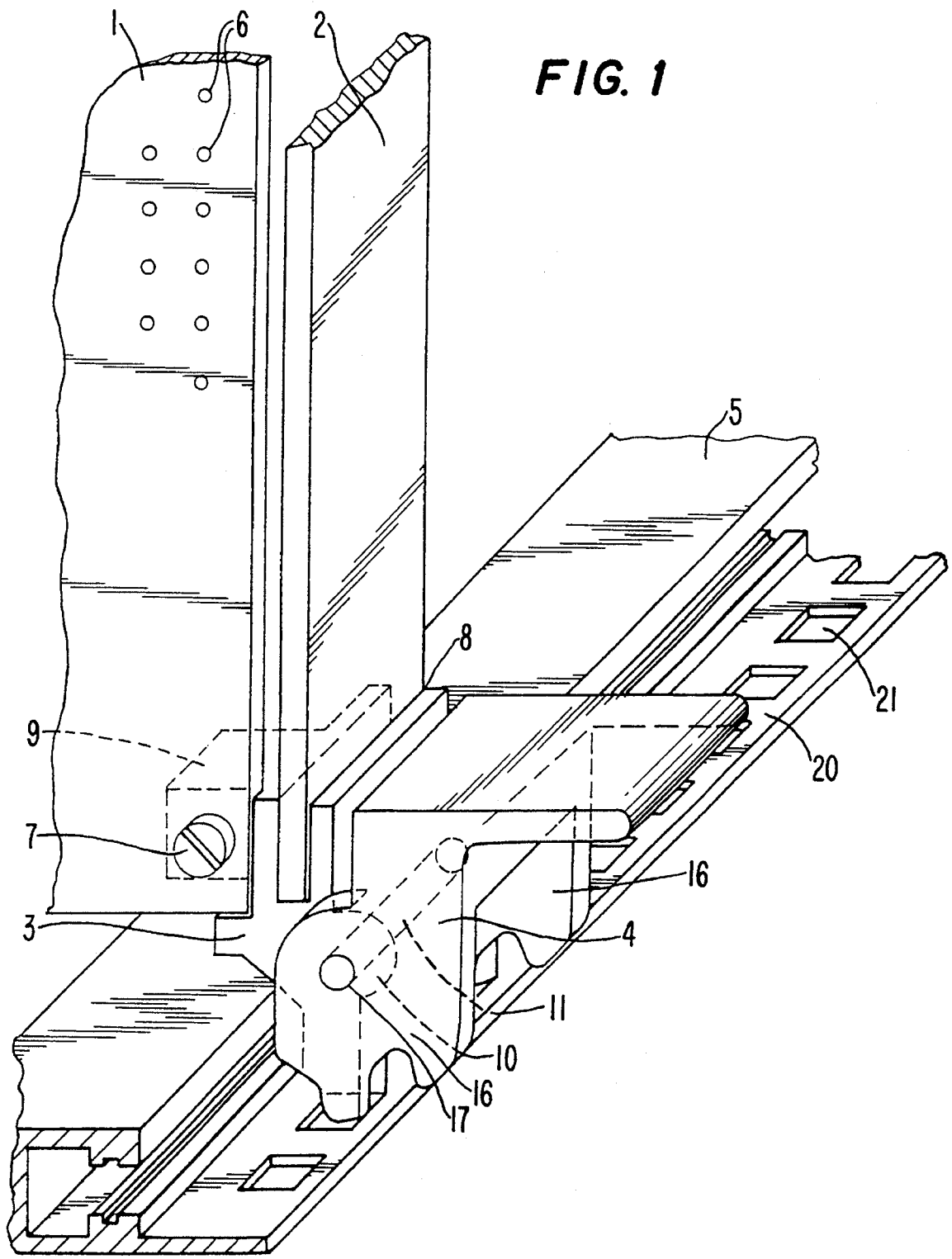
FIG. 1 is a fragmentary perspective view of the device according to a first embodiment of the invention showing a plug-in module in conjunction with a profile rail of a module rack on a twice enlarged scale.

The plug-in module, which is shown in FIGS. 1–6 in combination with a part of a module rack, is composed essentially, as shown in FIG. 1, of a printed wiring board 1, a front panel 2, a retaining block 3, and a bell crank 4, which constitutes the device for removing the plug-in module. This plug-in module is inserted into a module rack, only the front lower profile rail 5 of which is shown.

Printed wiring board 1, which is shown in fragmentary form, is made of insulating material and has a pattern of holes 6 for securing electronic or electrical components (not shown), which are connected to one another by means of conductor tracks (not shown). In the region of its lower front corner, printed wiring board 1 is screwed to the retaining block 3 by means of a cap screw 7.

On its rear edge, printed wiring board 1 carries the multiple contact strip of a multipin plug connector (not shown), by way of which it is disconnectably electrically connected to other components of the module rack.

Front panel 2 is made of aluminum and is also shown in fragmentary form. It is an elongated rectangular plate that is inserted and secured at its lower end into a crosswise slit 8 of retaining block 3. Retaining block 3 is made by diecasting, and has at its rear a bracket 9 with a thread for cap screw 7. Crosswise slit 8, cut deeply into retaining block 3, receives front panel 2 and has fastening means thereon, for instance a clamping screw, a wedge, or a clamp, for securing the front panel to the retaining block. Opposite bracket 9 is a bearing block 10 formed integrally with the bracket. Bearing block 10 has a semicircular cross section and protrudes at the front region of the retaining block. Bearing block 10 further includes a crosswise bore for receiving a cylindrical pivot pin 11 therein on which bell crank 4 is pivotally supported at both ends thereof.

As further seen in FIG. 2, retaining block 3 serves to connect front panel 2 to printed wiring board 1, to support bell crank 4, and to secure the plug-in module to front profile rail 5 of the module rack. Fastening of the plug-in module to profile rail 5 is done by means of a fastening screw (not shown) that passes through the retaining block 3 and engages a threaded hole of a threaded strip (not shown) which is in turn inserted into a double longitudinal groove 12 of profile rail 5. A positioning pin 13 disposed below bracket 9 and protruding into profile rail 5 makes it easier to insert the plug-in module into the module rack. In the region of the upper end of front panel 2, the plug-in module may have a second retaining block, provided with a bell crank, for securing the plug-in module to an upper front profile rail.

The two-armed bell crank 4 is pivotally connected to retaining block 3 by means of pivot pin 11 as discussed above. As further shown in FIG. 2, bell crank 4 has a long, slender lever arm 14 which serves as an actuation handle when the plug-in module is either being removed or inserted into the module rack, and a short and wide lever arm 15 disposed at approximately right angles to lever arm 14.

The short lever arm 15 of bell crank 4 is forked on its free end and therefore has two parallel side walls 16 (see FIG. 1). These side walls are located on both sides of bearing block 10, and each have a bearing hole 17 for receiving pivot pin 11 therein. Each side wall 16 further has a protrusion 18 on the free end thereof, both protrusions 18 being aligned with one another.

As seen in FIG. 3, front profile rail 5 of the module rack (only part of which is shown) has a deep and wide longitudinal channel 19 therein, which, at its side that is open toward bell crank 4, merges with the double longitudinal groove 12. Profile rail 5 has a thin, longitudinally extending front strip 20 provided with a number of equidistant rectangular recesses 21, which recesses are adapted to be engaged by protrusions 18 of short lever arm 15.

Referring back to FIG. 2, each of the two side walls 16 of short lever arm 15 has both an inner pressure-exerting shoulder 22 and an outer pressure-exerting shoulder 23 thereon. The disposition of the two pressure-exerting shoulders 22 and 23 is chosen such that when the plug-in module is in inserted position, as shown in FIG. 2, the inner pressure-exerting shoulder 22 rests on the upper part of front face 24 of the profile rail 5, while conversely the outer pressure-exerting shoulder 23 is located at a small distance 26 away from and opposite front edge 25 of front panel 20 of profile rail 5.

The two pressure-exerting shoulders 22 and 23 of short lever arm 15 are disposed at different distances from the pivot axis 27 of bell crank 4. The distance 28 between inner pressure-exerting shoulder 22 and pivot axis 27 is only about half the distance 29 between outer pressure-exerting shoulder 23 and pivot axis 27.

In bell crank 4, inner pressure-exerting shoulder 22 is formed by a part of outer face 30 of short lever arm 15, while outer pressure-exerting shoulder 23 is a component of a continuation 31 that protrudes from short lever arm 15.

In addition, a third pressure-exerting shoulder 32 may be provided on each protrusion 18 of short lever arm 15. When the plug-in module is inserted, as shown in FIG. 2, the third pressure-exerting shoulder 32 is located at a small distance away from and opposite the inner edge 33 of corresponding recess 21 provided in front strip 20.

In the embodiment of the device shown in FIG. 6, where like numerals correspond to like components discussed in reference to FIG. 1, bell crank 4, similar to the bell crank of FIG. 1, has an inner pressure-exerting shoulder 22 on the outer face 30 of its short lever arm 15 and an outer pressure-exerting shoulder 23 on continuation 31. However, in this embodiment, protrusions for aiding in the insertion of the plug-in module are not present, and the front strip 20 has no recesses to accommodate any protrusions therein.

The mode of operation of the device described is as follows.

For pulling out a plug-in module seated in a module rack and equipped with the device according to the first embodiment of the invention, pressure is exerted by hand from above (after the fastening screw of the retaining block has been loosened) on the long lever arm 14 in the direction of arrow a as shown in FIG. 2, bell crank 4 thereby executing a downward pivoting motion as indicated by arrow b. As a result of the above, inner pressure-exerting shoulder 22 presses against front face 24 of profile rail 5, and, as the initially high static friction forces of the many electrical spring contacts of the plug connectors are overcome, the plug-in module is removed from the module rack by being moved a first, short distance away from the profile rails 5 in the direction of arrow c. Because of the small distance 28 between the inner pressure-exerting shoulder 22 and the pivot axis 27 and the resultant advantageous high lever ratio, this operation can be accomplished without exerting particular force.

As best seen in FIG. 3, upon further pivoting of bell crank 4 and still before inner pressure-exerting shoulder 22 loses its contact with front face 24 of the profile rail entirely, the second, outer pressure-exerting shoulder 23 comes into contact with front edge 25 of front strip 20 of profile rail 5.

Referring to FIG. 4, if force now continues to be exerted on the long lever arm 14, outer pressure-exerting shoulder 23 then presses against front edge 25 of front strip 20 of profile rail 5, and inner pressure-exerting shoulder 22 leaves front face 24 of profile rail 5. Since outer pressure-exerting shoulder 23 has the greatest spacing 29 from pivot axis 27, a greater removal distance of the plug-in module can now be attained, at the same angular speed of the pivoting motion of bell crank 4.

As soon as long lever arm 14 has reached the (lower) end of its pivoting motion, as seen in FIG. 5, the knife strip is disconnected from the plug strip of the plug connection of the plug-in module, and protrusion 18 of the short lever arm 15 has emerged from recess 21, so that the plug-in module can now be removed from the module rack.

Protrusion 18 on the short lever arm 15, in conjunction with one of the recesses 21 of the front strip 20, serves as an insertion aid for the plug-in module. Before the plug-in module is inserted, bell crank 4 must for that purpose be brought to its lower pivoted position as shown in FIG. 5. Thereafter, for the insertion of the plug-in module to take place, long lever arm 14 should be pivoted upward, that is, counterclockwise and counter to the direction of the arrow b shown in FIG. 2.

If, as best seen in FIG. 3, an additional pressure-exerting shoulder 32 is provided on protrusion 18, then as the bell crank 4 is pressed downward—even before the second, outer pressure-exerting shoulder 23 has come into contact with front edge 25 of strip 20—this pressure-exerting shoulder 32 comes to contact with inner edge 33 of recess 21. The pressure now exerted on the bell crank 4 in order to remove the plug-in module brings about a further small motion of the plug-in module away from profile rail 5, by way of the additional pressure-exerting shoulder 32 on inner edge 33 of recess 21.

The invention now being fully described, it will be apparent to one of ordinary skill in the art that any changes and modifications can be made thereto without departing from the spirit or scope of the invention as set forth herein.

What is claimed is:

1. A device for removing a plug-in module adapted for insertion into a module rack, the module rack having a front profile rail including a front strip and a front face, the front strip having a front edge, the plug-in module comprising a retaining block for securing the plug-in module to the front profile rail of the module rack, a printed wiring board equipped with electronic components and screwed to the retaining block, and a front panel secured to the retaining block; the device for removing the plug-in module rack comprising a two-armed bell crank having a long lever arm and a short lever arm and being pivotally secured to the retaining block for pivotal movement with respect thereto about a pivot axis, the long lever arm of the bell crank constituting an actuation handle therefor, the short lever arm of the bell crank including an inner pressure exerting shoulder and an outer pressure exerting shoulder, the inner pressure exerting shoulder of the short lever arm resting on the front face of the profile rail when the plug-in module is inserted into the module rack, the outer pressure exerting shoulder being disposed at a distance from and opposite the front edge of the front strip when the plug-in module is inserted into the module rack, and the inner pressure-exerting shoulder being located at a distance from the pivot axis that is less than a distance between the outer pressure-exerting shoulder and the pivot axis.

2. The device according to claim 1, wherein the inner pressure-exerting shoulder is located at a distance from the pivot axis that is at most half the distance between the outer pressure-exerting shoulder and the pivot axis.

3. The device according to claim 1, wherein the short lever arm has an outer face, a portion of which forms the inner pressure-exerting shoulder.

4. The device according to claim 1, wherein the short lever arm includes a continuation, a portion of which forms the outer pressure-exerting shoulder.

5. The device according to claim 1, wherein the front strip includes a recess therein having an inner edge, and wherein the short lever arm further includes a protrusion thereon which is located opposite the inner edge of the recess when the plug-in module is inserted into the module rack.

6. The device according to claim 5, wherein the protrusion includes an additional pressure-exerting shoulder thereon which comes into contact with the inner edge of the recess during a downward actuation of the bell crank and before the outer pressure-exerting shoulder has come into contact with the front edge of the front strip.

* * * * *